(12) United States Patent
Wu et al.

(10) Patent No.: US 12,190,929 B2
(45) Date of Patent: Jan. 7, 2025

(54) MEMORY ARRAY, MEMORY CELL, AND DATA READ AND WRITE METHOD THEREOF

(71) Applicant: CHANGXIN MEMORY TECHNOLOGIES, INC., Hefei (CN)

(72) Inventors: Yulei Wu, Hefei (CN); Xiaoguang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 157 days.

(21) Appl. No.: 18/053,898

(22) Filed: Nov. 9, 2022

(65) Prior Publication Data

US 2023/0197133 A1   Jun. 22, 2023

(30) Foreign Application Priority Data

Dec. 20, 2021   (CN) .......................... 202111564800.2

(51) Int. Cl.
*G11C 7/02*   (2006.01)
*G11C 11/16*  (2006.01)

(52) U.S. Cl.
CPC ...... *G11C 11/1675* (2013.01); *G11C 11/1655* (2013.01); *G11C 11/1657* (2013.01); *G11C 11/1673* (2013.01)

(58) Field of Classification Search
CPC ............ G11C 11/1675; G11C 11/1655; G11C 11/1657; G11C 11/1673
USPC ....................................................... 365/209
See application file for complete search history.

(56) References Cited

U.S. PATENT DOCUMENTS

| | | | | |
|---|---|---|---|---|
| 7,885,095 B2 * | 2/2011 | Sakimura | ............ | G11C 11/1657 365/158 |
| 7,995,378 B2 * | 8/2011 | Yoon | .................... | G11C 11/1673 365/158 |
| 8,547,734 B1 * | 10/2013 | Abedifard | ........... | G11C 11/1697 365/158 |
| 8,804,413 B2 * | 8/2014 | Li | .......................... | H10B 61/00 365/158 |
| 9,218,868 B2 * | 12/2015 | Noguchi | ............. | G11C 11/1693 |
| 9,437,272 B1 * | 9/2016 | Lu | ......................... | G11C 11/1673 |
| 9,583,167 B2 * | 2/2017 | Chan | ....................... | H10B 61/22 |
| 9,646,668 B2 * | 5/2017 | Zhou | .................... | G11C 11/1675 |
| 10,069,628 B2 * | 9/2018 | Tomishima | .............. | G09C 1/00 |
| 10,304,511 B1 * | 5/2019 | Alam | ................... | G11C 11/1673 |
| 10,347,323 B2 * | 7/2019 | Kim | ...................... | G11C 11/4091 |
| 10,665,281 B1 * | 5/2020 | Jacob | .................... | G11C 11/1653 |
| 10,803,916 B2 * | 10/2020 | Bozdag | ................ | H01F 10/3286 |
| 11,437,083 B2 * | 9/2022 | Dutta | ..................... | H10B 61/22 |
| 2014/0233305 A1 * | 8/2014 | Kim | ........................ | G11C 11/15 365/158 |
| 2020/0043535 A1 | 2/2020 | Bozdag et al. | | |

* cited by examiner

*Primary Examiner* — Viet Q Nguyen
(74) *Attorney, Agent, or Firm* — Kilpatrick Townsend & Stockton LLP (57) ABSTRACT

The present disclosure provides a memory array, a memory cell, and a data read and write method thereof. Two storage nodes are provided in each memory cell of a memory array of a magnetic random access memory (MRAM), such that when one storage node in the memory cell fails, the other storage node in the memory cell can be used to write and read data.

20 Claims, 4 Drawing Sheets

MEMORY ARRAY, MEMORY CELL, AND DATA READ AND WRITE METHOD THEREOF

CROSS-REFERENCE TO RELATED APPLICATION

This application claims the priority of Chinese Patent Application No. 202111564800.2, submitted to the Chinese Intellectual Property Office on Dec. 20, 2021, the disclosure of which is incorporated herein in its entirety by reference.

TECHNICAL FIELD

The present disclosure relates to the technical field of memories, and in particular, to a memory array, a memory cell, and a data read and write method thereof.

BACKGROUND

A magnetic random access memory (MRAM) is a non-volatile memory, which has such characteristics as high read and write speed, high integration, and many times of repeated read and write, and has been widely used in current computers and other devices.

In the prior art, the MRAM includes a memory array including a plurality of memory cells, and each memory cell may read or write data ("0" or "1") through its magnetic tunnel junction (MTJ).

However, in the prior art, since the MTJ in the memory cell is easily damaged and has a short effective life, the stability of the MRAM is poor.

SUMMARY

A first aspect of the present disclosure provides a memory cell, including: a first storage node separately connected to a first terminal of a transistor and a first bit line; a second storage node separately connected to the first terminal of the transistor and a second bit line; and the transistor provided with a second terminal connected to a source line and a third terminal connected to a word line.

A second aspect of the present disclosure provides a memory array, including: m source lines, m word lines, n first bit lines, n second bit lines, and memory cells of m rows and n columns, where the memory cells are the memory cell according to the first aspect of the present disclosure, and m and n are positive integers; and each of the memory cells located on a same row are connected to a same word line and a same source line, the first storage node of each of the memory cells located on a same column is connected to a same first bit line, and the second storage node of each of the memory cells located on a same column is connected to a same second bit line.

A third aspect of the present disclosure provides a data read and write method of a memory cell, including: performing data writing or data reading on the memory cell according to the first aspect of the present disclosure.

A fourth aspect of the present disclosure provides a data read and write device of a memory cell, including: a write module configured to perform data writing on the memory cell according to the first aspect of the present disclosure; and a read module configured to perform data reading on the memory cell according to the first aspect of the present disclosure.

BRIEF DESCRIPTION OF THE DRAWINGS

To describe the technical solutions in the embodiments of the present disclosure or in the prior art more clearly, the following briefly describes the drawings required for describing the embodiments or the prior art. Apparently, the drawings in the following description merely show some embodiments of the present disclosure, and those of ordinary skill in the art may still derive other drawings from these drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those of ordinary skill in the art based on the embodiments of the present disclosure without creative efforts should fall within the protection scope of the present disclosure.

The terms "first", "second", "third" and so on (if any) in the specification, claims and the accompanying drawings of the present disclosure are intended to distinguish between similar objects but do not necessarily indicate a specific order or sequence. It should be understood that the data used in such a way may be exchanged under proper conditions to make it possible to implement the described embodiments of the present disclosure in other sequences apart from those illustrated or described herein. Moreover, the terms "include", "contain", and any other variants mean to cover the non-exclusive inclusion, for example, a process, method, system, product, or device that includes a list of steps or units is not necessarily limited to those steps or units which are clearly listed, but may include other steps or units which are not expressly listed or inherent to such a process, method, system, product, or device.

Figure 1:
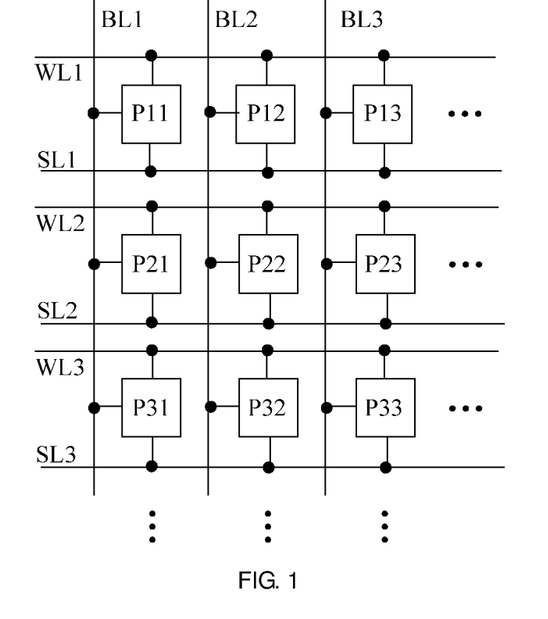
FIG. 1 is a schematic structural diagram of a memory array of an MRAM.

FIG. 1 is a schematic structural diagram of a memory array of an MRAM, showing a basic composition of the MRAM. The memory array of the MRAM includes memory cells arranged in rows and columns, which are sequentially marked as P11, P12, P13 . . . etc. according to a row and column arrangement rule of the memory cells. In each memory cell, the MTJ is specifically configured to read, write, and store information ("0" or "1"). In some embodiments, the MTJ includes a bottom electrode layer, a free layer, a tunnel barrier layer, a reference layer, and a top electrode layer.

Figure 2:
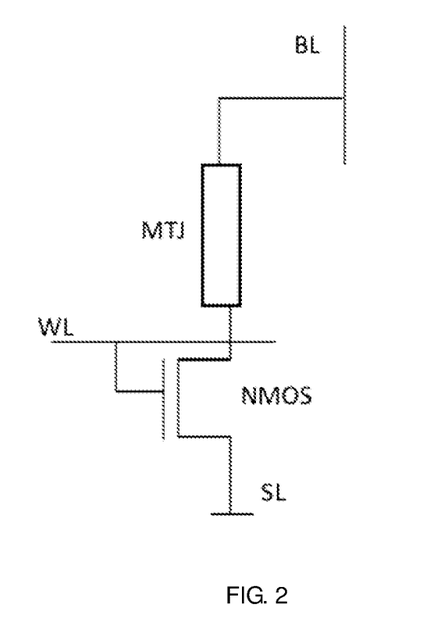
FIG. 2 is a schematic structural diagram of a memory cell of an MRAM.

FIG. 2 is a schematic structural diagram of a memory cell of an MRAM. As shown in FIG. 2, in the memory array shown in FIG. 1, the memory cell includes the MTJ and an N-metal-oxide-semiconductor (NMOS), and the NMOS may be configured to control a current flowing through the MTJ. When writing or reading is required for the MTJ, the NMOS is turned on, the word line (WL) is connected to a gate of the NMOS, a source of the NMOS is connected to the source line (SL), a drain of the NMOS is connected to one terminal of the MTJ (which may be the bottom electrode layer or the top electrode layer of the MTJ), the bit line (BL) is connected to the other terminal of the MTJ, and a read operation or a write operation is performed on the MTJ through a level of the word line, a level of the bit line, and a level of a select line together.

However, in the MRAM using the structures shown in FIG. 1 and FIG. 2, since the MTJ in the memory cell is easily damaged and has a short effective life, when the MTJ in one memory cell fails to read and write the data, the normal operation of the memory array of the entire MRAM is affected, and the stability of the MRAM is greatly reduced.

Therefore, according to the memory array of the MRAM, the memory cell, and the data read and write method thereof provided in the embodiments of the present disclosure, since two MTJs are provided in the memory cell of the MRAM, even if one MTJ in the memory cell fails to read and write the data, the other MTJ in the memory cell can continue reading and writing the data, thereby improving the endurance and retention of the memory cell, ensuring that the normal operation of the memory array of the entire MRAM may not be affected by the failure of any MTJ in one memory cell, and thus improving the stability of the MRAM.

The technical solution of the present disclosure will be described in detail below with reference to specific embodiments. The following specific embodiments may be combined with each other, and the same or similar concepts or processes may not be repeatedly described in some embodiments.

Figure 3:
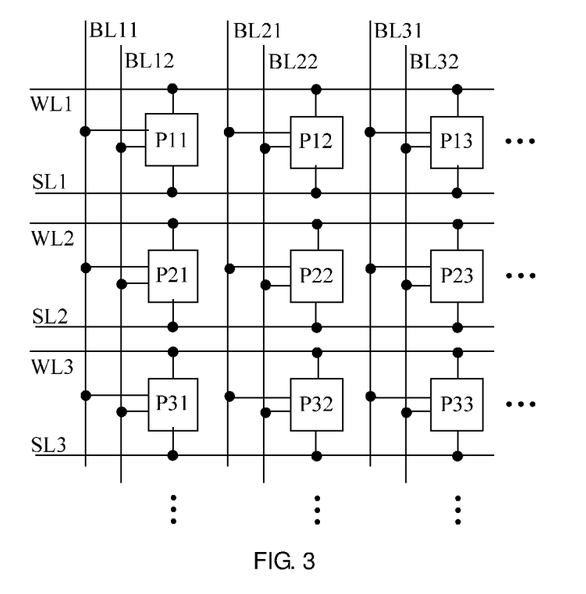
FIG. 3 is a schematic structural diagram of one embodiment of a memory array of an MRAM according to the present disclosure.

FIG. 3 is a schematic structural diagram of one embodiment of a memory array of an MRAM according to the present disclosure. The memory array shown in FIG. 3 includes: m source lines SL laterally arranged in the figure, marked as SL1, SL2, SL3 . . . ; m word lines WL laterally arranged in the figure, marked as WL1, WL2, WL3 . . . ; n first bit lines BL longitudinally arranged in the figure, marked as BL11, BL21, BL31 . . . ; n second bit lines BL marked as BL12, BL22, BL32 . . . ; and memory cells of m rows and n columns marked as P11, P12, P13 . . . P21, P22, P23 . . . P31, P32, P33 . . . m and n are positive integers.

In the embodiment shown in FIG. 3, each memory cell located on a same row is connected to a same word line WL. For example, the memory cells P11, P12, P13 . . . on the first row are connected to the word line WL1, and so on. Each memory cell located on a same row is connected to a same source line SL. For example, the memory cells P11, P12, P13 . . . on the first row are connected to the source line SL1, and so on. Each memory cell located on a same column is separately connected to the first bit line and the second bit line. For example, the memory cells P11, P21, P31 . . . on the first column are separately connected to the first bit line BL11, the memory cells P11, P21, P31 . . . on the first column are separately connected to the second bit line BL12, and so on.

In some embodiments, in the memory array shown in FIG. 3, the first bit line and the second bit line separately connected to a same column of memory cells are connected in parallel. For example, the first bit line BL11 and the second bit line BL12 separately connected to the memory cells P11, P21, P31 . . . on the first column are connected in parallel, and the first bit line BL21 and the second bit line BL22 separately connected to the memory cells P12, P22, P32 . . . on the second column are connected in parallel.

Figure 4:
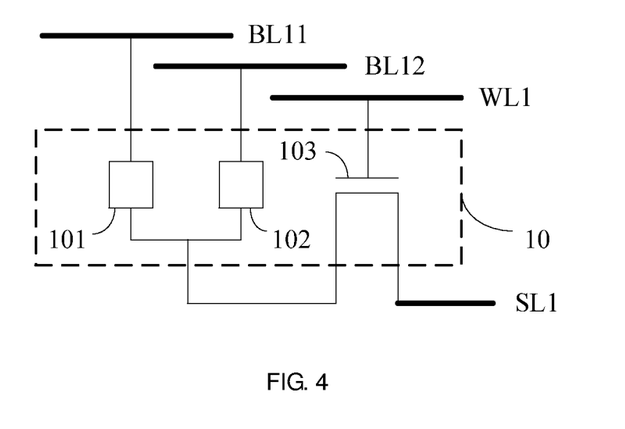
FIG. 4 is a schematic structural diagram of one embodiment of a memory cell of an MRAM according to the present disclosure.

FIG. 4 is a schematic structural diagram of one embodiment of a memory cell of an MRAM according to the present disclosure, showing the structure of any memory cell in the memory array of the MRAM shown in FIG. 3. As shown in FIG. 4, taking the memory cell P11 on the first row and first column in the memory array in FIG. 3 as an example, the memory cell 10 provided in this embodiment includes a first storage node 101, a second storage node 102, and a transistor 103.

In some embodiments, the first storage node 101 may be an MTJ, marked as a first MTJ. The first MTJ is provided with a first terminal connected to the first bit line BL11 and a second terminal connected to a first terminal of the transistor 103. The second storage node 102 may be an MTJ, marked as a second MTJ. The second MTJ is provided with a first terminal connected to the second bit line BL12 and a second terminal connected to the first terminal of the transistor 103. The first terminal of the transistor 103 is connected to the second terminal of the first MTJ and the second terminal of the second MTJ at the same time. The transistor 103 is provided with a second terminal connected to the source line SL1 and a third terminal connected to the word line WL1.

In some embodiments, the first MTJ and the second MTJ are arranged in parallel, and can be independently operated, without being affected by the other MTJ.

In some embodiments, the MTJ may sequentially include a bottom electrode layer, a free layer, a tunnel barrier layer, a reference layer, and a top electrode layer. The first terminal of the first MTJ/the second MTJ may be the bottom electrode layer, and the second terminal of the first MTJ/the second MTJ may be the top electrode layer; or, the first terminal of the first MTJ/the second MTJ may be the top electrode layer, and the second terminal of the first MTJ/the second MTJ may be the bottom electrode layer.

In some embodiments, the first MTJ and the second MTJ have the same magnetic characteristic. The magnetic characteristic may specifically be magnetic anisotropy, then when the first MTJ and the second MTJ are arranged in parallel, the memory cell may perform data writing or data reading on any of the first MTJ and the second MTJ.

In some embodiments, the first MTJ and the second MTJ have different magnetic characteristics. At this time, the memory cell may determine to perform the data writing or data reading on any of the first MTJ and the second MTJ according to operating parameters such as a switch current.

For example, the first MTJ and the second MTJ may have different magnetic characteristics by setting the first MTJ and the second MTJ into different sizes and/or changing magnetic anisotropy of a readout layer.

In some embodiments, each memory cell in the memory array shown in FIG. 3 may employ the structure shown in FIG. 4. At this time, the first storage node of each memory cell located on a same column in the memory array is connected to a same first bit line. For example, the first storage node of each memory cell in the memory cells P11, P21, P31 . . . on the first column is connected to the first bit line BL11, the second storage node of each memory cell in the memory cells P11, P21, P31 . . . on the first column is connected to the second bit line BL12, and so on.

The memory cell 10 shown in FIG. 4 includes two storage nodes, such that any of the storage nodes may be configured to perform the data writing or the data reading on the memory cell 10.

Figure 5:
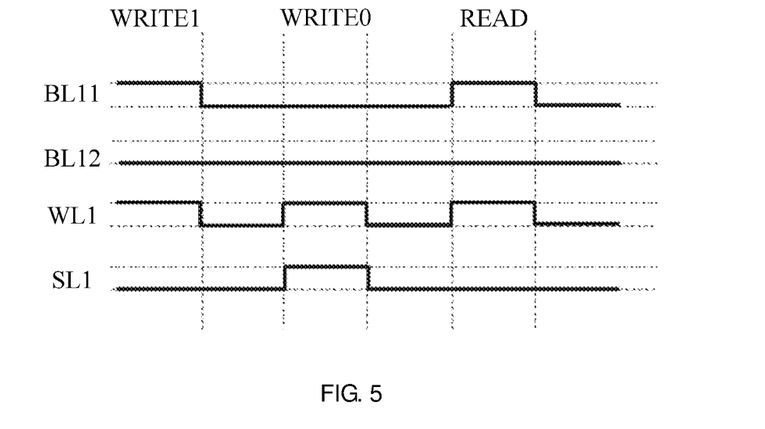
FIG. 5 is a schematic diagram of control timing when data writing and data reading are performed on a first storage node by a memory cell according to the present disclosure.

For example, FIG. 5 is a schematic diagram of control timing when data writing and data reading are performed on a first storage node by a memory cell according to the present disclosure. When the data writing or the data reading is performed on the first storage node of the memory cell, the second bit line BL12 connected to the second storage node needs to be kept at a low level, such that the second storage node is in a floating state, and the data writing or the data reading cannot be performed.

Furthermore, in combination with the memory cell shown in FIG. 4, when the first bit line BL11 connected to the first storage node is at a high level, the word line WL1 connected to the transistor 103 is at a high level, and the source line SL1 connected to the transistor 103 is at a low level, an operation of writing data 1 (WRITE1) is performed on the first storage node of the memory cell. When the first bit line BL11 connected to the first storage node is at a low level, the word line WL1 connected to the transistor 103 is at a high level, and the source line SL1 connected to the transistor 103 is at a high level, an operation of writing data 0 (WRITE0) is performed on the first storage node of the memory cell. When the first bit line BL11 connected to the first storage node is at a high level, the word line WL1 connected to the transistor 103 is at a high level, and the source line SL1 connected to the transistor 103 is at a low level, an operation of reading data (read) is performed on the first storage node of the memory cell.

Figure 6:
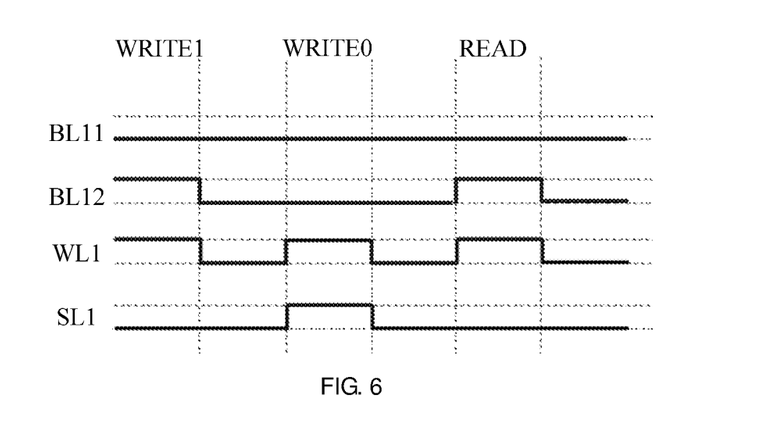
FIG. 6 is a schematic diagram of control timing when data writing and data reading are performed on a second storage node by a memory cell according to the present disclosure.

FIG. 6 is a schematic diagram of control timing when data writing and data reading are performed on a second storage node by a memory cell according to the present disclosure. When the data writing or the data reading is performed on the second storage node of the memory cell, the first bit line BL11 connected to the first storage node needs to be kept at a low level, such that the first storage node is in a floating state, and the data writing or the data reading cannot be performed.

Furthermore, in combination with the memory cell shown in FIG. 4, when the second bit line BL12 connected to the second storage node is at a high level, the word line WL1 connected to the transistor 103 is at a high level, and the source line SL1 connected to the transistor 103 is at a low level, the operation of writing data 1 (WRITE1) is performed on the second storage node of the memory cell. When the second bit line BL12 connected to the second storage node is at a low level, the word line WL1 connected to the transistor 103 is at a high level, and the source line SL1 connected to the transistor 103 is at a high level, the operation of writing data 0 (WRITE0) is performed on the second storage node of the memory cell. When the second bit line BL12 connected to the second storage node is at a high level, the word line WL1 connected to the transistor 103 is at a high level, and the source line SL1 connected to the transistor 103 is at a low level, the operation of reading data (read) is performed on the second storage node of the memory cell.

In conclusion, according to the memory array of the MRAM and the memory cell provided in this embodiment, two storage nodes are provided in each memory cell of the memory array, such that when one storage node in the memory cell fails, the other storage node in the memory cell can be used to write and read data, thereby prolonging the endurance and retention of the memory cell, prolonging the service life, ensuring that the normal operation of the memory array of the entire MRAM may not be affected by the failure of any storage node in one memory cell, and thus further improving the stability of the MRAM.

The present disclosure further provides a data read and write method of a memory cell, which can be configured to perform data writing or data reading on the memory cell according to any embodiment above in the present disclosure.

In some embodiments, taking the memory cell shown in FIG. 4 as an example, the performing data writing or data reading on the memory cell includes: control the first storage node to perform the data writing or the data reading through the first bit line BL11, the source line SL1, and the word line WL1 connected to the memory cell. Or, the performing data writing or data reading on the memory cell includes: control the second storage node to perform the data writing or the data reading through the second bit line BL12, the source line SL1, and the word line WL1 connected to the memory cell.

Figure 7:
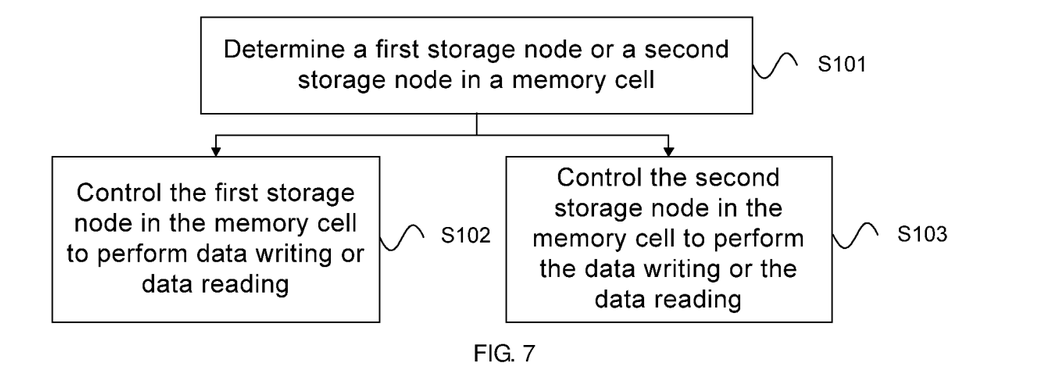
FIG. 7 is a schematic flow diagram of one embodiment of a data read and write method of a memory cell according to the present disclosure.

FIG. 7 is a schematic flow diagram of one embodiment of a data read and write method of a memory cell according to the present disclosure, which is configured to perform the data writing operation or the data reading operation on the first storage node or the second storage node in the memory cell shown in FIG. 4. The implementation body of the method shown in FIG. 7 may be any controller, control device, chip, etc. having relevant processing capabilities. Taking an example where the implementation body is a controller of the memory array of the MRAM, before the controller performs the data writing or the data reading on the memory cell, the first storage node or the second storage node in the memory cell is determined first through S101 to perform a subsequent operation; when it is determined in S101 that the subsequent operation is performed on the first storage node in the memory cell, the operation of data writing or data reading is performed on the first storage node through S102; and when it is determined in S101 that the subsequent operation is performed on the second storage node in the memory cell, the operation of data writing or data reading is performed on the second storage node through S103.

In conclusion, according to the read and write method of the memory cell provided in this embodiment, when the controller performs the data writing or the data reading on the memory cell in the memory array, one of two storage nodes in the memory cell is determined first, and then the operation of data writing or data reading is performed on the determined storage node, such that when one of the storage nodes in the memory cell fails, the controller may also control to perform the data writing and the data reading on the other storage node in the memory cell, thereby ensuring normal data reading or data writing of the controller, not affecting the normal operating process of the controller, and improving the stability of the controller in the MRAM during data writing and data reading.

In some embodiments, in S101 shown in FIG. 7, the controller specifically determines, according to whether the first storage node fails, the first storage node or the second storage node to perform the subsequent operation. In this embodiment, the magnetic characteristic of the first MTJ in the first storage node and the magnetic characteristic of the second MTJ in the second storage node may be set to be the same, and at this time, the first storage node and the second storage node have the same function and operating parameter, which may be mutually redundant. For example, it can be defaulted to perform the operation of data writing or data reading on the first storage node in the memory cell. After it is determined in S101 that the first storage node fails, it is determined to perform the operation of data writing or data reading on the second storage node in the memory cell. The controller may specifically determine, according to a read and write state identifier of the first storage node, whether the first storage node fails. The read and write state identifier may be configured to indicate whether the first storage node fails; and when the first storage node fails, the operation of data writing or data reading cannot be performed.

In some other embodiments, when the first MTJ and the second MTJ have the same magnetic characteristic, the operation may also be cyclically performed on the first storage node and the second storage node. For example, within a preset period of time, the operation of data writing or data reading may be performed on the first storage node in the memory cell, and within a next preset period of time, the operation of data writing or data reading may be performed on the second storage node in the memory cell, which are cyclically performed, thereby avoiding frequent data reading or data writing on one storage node, and reducing the probability of faults due to frequent use of the storage node. In the circulating process, when one storage node in the memory cell fails, the circulation within the preset period of time may be stopped, and the data reading or the data writing is performed on the normal storage node in the memory cell subsequently.

In some embodiments, for the entire memory array of the MRAM, the controller may record, in a form of identification information in Table 1 below, a storage node row corresponding to each memory cell in the memory array controlled by the controller. For example, the identification information MTJx in the first row and first column in Table 1 is configured to indicate that the operation of data writing or data reading is performed on the memory cell P11 in the memory array by using the x-th storage node. When x is 1, MTJ1 is configured to indicate the first storage node in the memory cell P11; when x is 2, MTJ2 is configured to indicate the second storage node in the memory cell P11, and so on. Before the controller performs the data writing or the data reading on each memory cell in the memory array, the first storage node or the second storage node in the memory cell is determined first through Table 1, and then the data writing or the data reading is performed on the determined storage node in the memory cell.

TABLE 1

| P11 (MTJx) | P12 (MTJx) | P13 (MTJx) | . . . |
| P21 (MTJx) | P22 (MTJx) | P23 (MTJx) | . . . |
| P31 (MTJx) | P32 (MTJx) | P33 (MTJx) | . . . |
| . . . | . . . | . . . | . . . |

In some embodiments, the identification information of each memory cell shown in Table 1 may be preset, or may be specified by the controller of the MRAM or other devices and may be adjusted in real time.

In some embodiments, each memory cell may be recorded in Table 1 according to an address path of the memory cell, and the identification information corresponding to the memory cell is also recorded.

In some other embodiments, when the first MTJ and the second MTJ have different magnetic characteristics, in S101 shown in FIG. 7, the controller may select, according to the target magnetic characteristic required when the writing or the reading is performed on the memory cell processed currently, the first MTJ or the second MTJ having the same magnetic characteristic, to perform subsequent operation of data writing or data reading on the first storage node where the first MTJ is located or the second storage node where the second MTJ is located.

For example, if the controller controls the memory cell, and the target magnetic characteristic of the MTJ corresponding to a switch current value that can be provided is the same as the magnetic characteristic of the first MTJ, the controller performs the data writing or the data reading on the first storage node; and if the target magnetic characteristic is the same as the magnetic characteristic of the second MTJ, the controller performs the data writing or the data reading on the second storage node.

Figure 8:
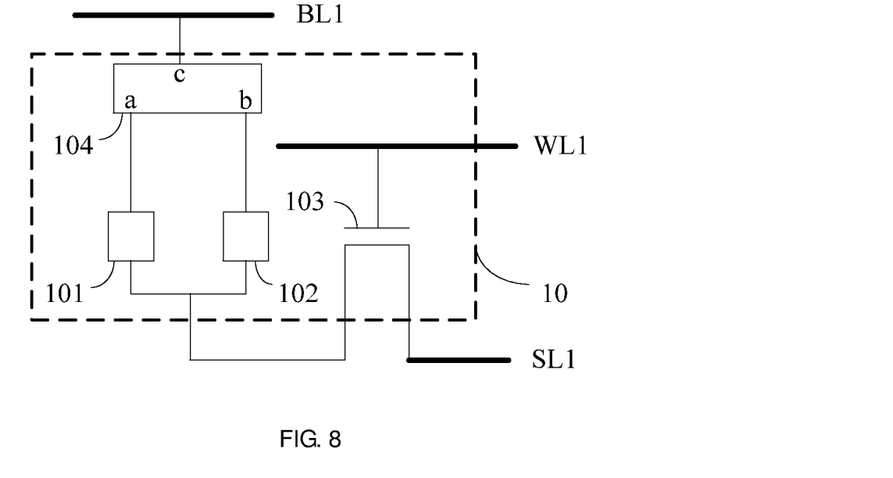
FIG. 8 is a schematic structural diagram of one embodiment of a memory cell of an MRAM according to the present disclosure.

Therefore, in this embodiment, different storage nodes in the memory cell can be flexibly selected when the controller controls the memory cell, thereby making the use of the memory cell more intelligent, enriching usage scenarios of the memory cell, enabling to perform the data writing or the data reading on a more suitable storage node of the memory cell, and improving the operating stability and operating efficiency of the MRAM. In some embodiments, FIG. 8 is a schematic structural diagram of one embodiment of a memory cell of an MRAM according to the present disclosure. In the embodiment shown in FIG. 8, on the basis that two storage nodes are provided in the memory cell 10, the two storage nodes in the memory cell 10 are selected through a switch structure 104; and at this time, the memory array where the memory cell is located may provide one bit line BL for each column of memory cells, thereby implementing the memory array structure shown in FIG. 1. For example, the first terminal of the first storage node 101 shown in FIG. 8 is connected to a first terminal a of the switch structure 104, the first terminal of the second storage node 102 is connected to a second terminal b of the switch structure 104, and a third terminal c of the switch structure 104 is connected to the bit line BL1.

The switch structure 104 may be configured to control conduction between the first terminal a and the third terminal c thereof, such that the operation of data writing or data reading can be performed on the first storage node 101 in the memory cell 10; or, the switch structure may be configured to control conduction between the second terminal b and the third terminal c thereof, such that the operation of data writing or data reading can be performed on the second storage node 102 in the memory cell 10.

Figure 9:
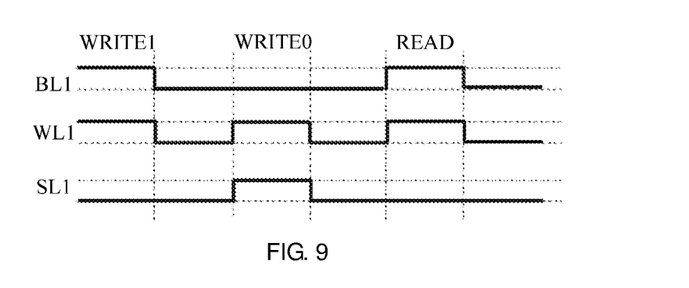
FIG. 9 is a schematic diagram of control timing when data writing and data reading are performed on a first storage node or a second storage node of a memory cell according to the present disclosure.

FIG. 9 is a schematic diagram of control timing when data writing and data reading are performed on a first storage node or a second storage node of a memory cell according to the present disclosure, showing the control timing when the data writing and the data reading are performed on the first storage node or the second storage node shown in FIG. 8. When the first terminal a and the third terminal c of the switch structure 104 are turned on, the bit line BL1 is at a high level, the word line WL1 connected to the transistor 103 is at a high level, and the source line SL1 connected to the transistor 103 is at a low level, the operation of writing data 1 (WRITE1) is performed on the first storage node of the memory cell. When the second terminal b and the third terminal c of the switch structure are turned on, the bit line BL1 is at a low level, the word line WL1 connected to the transistor 103 is at a high level, and the source line SL1 connected to the transistor 103 is at a high level, the operation of writing data 0 (WRITE0) is performed on the first storage node of the memory cell. When the first bit line BL11 connected to the first storage node is at a high level, the word line WL1 connected to the transistor 103 is at a high level, and the source line SL1 connected to the transistor 103 is at a low level, the operation of reading data (read) is performed on the first storage node of the memory cell.

In conclusion, in addition to two storage nodes in the memory cell, the switch structure is further provided in the memory cell provided in this embodiment, such that when one storage node in the memory cell fails, and the other storage node in the memory cell can be used to write and read data, the bit line and one storage node may be connected through the switch structure, thereby further reducing the structural complexity of the memory array of the entire MRAM, and making the layout simpler and more compact on the basis of prolonging the endurance and retention of the memory cell, prolonging the service life, and improving the stability of the MRAM.

The aforementioned embodiments introduce the data read and write method of the memory cell provided by embodiments of the present disclosure. In order to realize the functions in the data read and write method of the memory cell provided by embodiments of the present disclosure, the controller as an implementation body may include a hardware structure and/or software module to realize the above functions in the form of the hardware structure, the software module, or the hardware structure in combination with the software module. One of the above functions is carried out in the form of a hardware structure, a software module, or a hardware structure in combination with a software module, depending on particular applications and design constraint conditions of the technical solutions.

Figure 10:
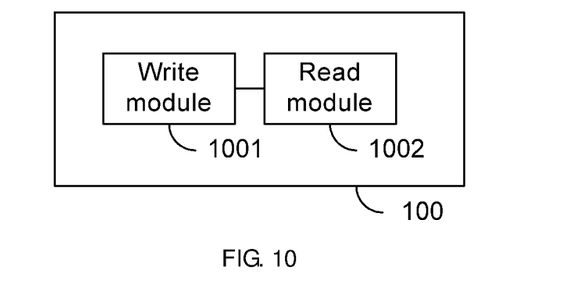
FIG. 10 is a schematic structural diagram of a data read and write device of a memory cell according to the present disclosure.

For example, FIG. 10 is a schematic structural diagram of a data read and write device of a memory cell according to the present disclosure. The device 100 shown in FIG. 10 includes a write module 1001 and a read module 1002. The write module 1001 is configured to write data into the memory cell according to any embodiment of the present disclosure, and the read module 1002 is configured to read the data from the memory cell according to any embodiment of the present disclosure.

Specifically, for the specific principles and implementations of the above steps performed by the modules in the data read and write device of the memory cell, reference may be made to the descriptions in the data read and write method of the memory cell in the foregoing embodiments of the present disclosure, which are not described herein again.

Finally, it should be noted that the foregoing embodiments are used only to explain the technical solutions of the present disclosure, but are not intended to limit the present disclosure. Although the present disclosure has been described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the scope of the technical solutions of the embodiments of the present disclosure.

The invention claimed is:

1. A memory cell, comprising:
   a first storage node, separately connected to a first terminal of a transistor and a first bit line;
   a second storage node, separately connected to the first terminal of the transistor and a second bit line;
   the transistor, provided with a second terminal connected to a source line and a third terminal connected to a word line; and
   a switch structure, configured to control conduction between a first terminal and a third terminal thereof, or to control the conduction between a second terminal and the third terminal thereof.

2. The memory cell according to claim 1, wherein the first storage node and the second storage node are arranged in parallel.

3. The memory cell according to claim 1, wherein the first storage node comprises a first magnetic tunnel junction provided with a first terminal connected to the first bit line and a second terminal connected to the first terminal of the transistor, and having a first magnetic characteristic;
   the second storage node comprises a second magnetic tunnel junction provided with a first terminal connected to the second bit line and a second terminal connected to the first terminal of the transistor, and having a second magnetic characteristic; and
   the first magnetic characteristic is different from the second magnetic characteristic.

4. The memory cell according to claim 3, wherein the first magnetic tunnel junction and/or the second magnetic tunnel junction each comprise a bottom electrode layer, a free layer, a tunnel barrier layer, a reference layer, and a top electrode layer.

5. A memory array, comprising:
   m source lines, m word lines, n first bit lines, n second bit lines, and memory cells of m rows and n columns, wherein the memory cells are the memory cell according to claim 1, and m and n are positive integers; and
   each of the memory cells located on a same row are connected to a same word line and a same source line, the first storage node of each of the memory cells located on a same column is connected to a same first bit line, and the second storage node of each of the memory cells located on a same column is connected to a same second bit line.

6. The memory array according to claim 5, wherein the first bit lines and the second bit lines are arranged in parallel.

7. A data read and write method of a memory cell, comprising:
   performing data writing or data reading on the memory cell according to claim 1.

8. The method according to claim 7, wherein the performing data writing or data reading on the memory cell comprises: controlling the first storage node to perform the data writing or the data reading through the first bit line, the source line, and the word line.

9. The method according to claim 7, wherein the performing data writing or data reading on the memory cell comprises: controlling the second storage node to perform the data writing or the data reading through the second bit line, the source line, and the word line.

10. The method according to claim 8, wherein the performing data writing or data reading on the memory cell comprises:
    determining whether the first storage node fails;
    when yes, performing the data writing or the data reading on the second storage node; and when not, performing the data writing or the data reading on the first storage node.

11. The method according to claim 10, wherein
the determining whether the first storage node fails comprises: determining, according to a read and write state identifier of the first storage node, whether the first storage node fails.

12. The method according to claim 8, wherein
the performing data writing or data reading on the memory cell comprises:
determining a first magnetic characteristic of the first storage node, a second magnetic characteristic of the second storage node, and a target magnetic characteristic required when the data writing or the data reading is performed on the memory cell;
performing the data writing or the data reading on the first storage node when the target magnetic characteristic is the same as the first magnetic characteristic; and
performing the data writing or the data reading on the second storage node when the target magnetic characteristic is the same as the second magnetic characteristic.

13. A data read and write device of a memory cell, comprising:
a write module, configured to perform data writing on the memory cell according to claim 1; and
a read module, configured to perform data reading on the memory cell according to claim 1.

14. The device according to claim 13, wherein
the write module is configured to control the first storage node to perform the data writing through the first bit line, the source line, and the word line, and to control the second storage node to perform the data writing through the second bit line, the source line, and the word line; and
the read module is configured to control the first storage node to perform the data reading through the first bit line, the source line, and the word line, and to control the second storage node to perform the data reading through the second bit line, the source line, and the word line.

15. A data read and write method of a memory cell, comprising:
providing the memory cell comprising:
a first storage node, separately connected to a first terminal of a transistor and a first bit line;
a second storage node, separately connected to the first terminal of the transistor and a second bit line;
the transistor, provided with a second terminal connected to a source line and a third terminal connected to a word line; and
a switch structure, configured to control conduction between a first terminal and a third terminal thereof, or to control the conduction between a second terminal and the third terminal thereof;
performing data writing or data reading on the memory cell comprising:
determining whether the first storage node fails, wherein
when it is determined that the first storage node fails, performing the data writing or the data reading on the second storage node; and
when it is determined that the first storage node does not fail, performing the data writing or the data reading on the first storage node.

16. The method according to claim 15, wherein
the performing data writing or data reading on the memory cell comprises: controlling the first storage node to perform the data writing or the data reading through the first bit line, the source line, and the word line.

17. The method according to claim 15, wherein
the performing data writing or data reading on the memory cell comprises: controlling the second storage node to perform the data writing or the data reading through the second bit line, the source line, and the word line.

18. The method according to claim 15, wherein
the determining whether the first storage node fails comprises: determining, according to a read and write state identifier of the first storage node, whether the first storage node fails.

19. The method according to claim 15, wherein
the performing data writing or data reading on the memory cell comprises:
determining a first magnetic characteristic of the first storage node, a second magnetic characteristic of the second storage node, and a target magnetic characteristic required when the data writing or the data reading is performed on the memory cell;
performing the data writing or the data reading on the first storage node when the target magnetic characteristic is the same as the first magnetic characteristic; and
performing the data writing or the data reading on the second storage node when the target magnetic characteristic is the same as the second magnetic characteristic.

20. A data read and write method of a memory cell, comprising:
providing the memory cell comprising:
a first storage node, separately connected to a first terminal of a transistor and a first bit line;
a second storage node, separately connected to the first terminal of the transistor and a second bit line;
the transistor, provided with a second terminal connected to a source line and a third terminal connected to a word line; and
a switch structure, configured to control conduction between a first terminal and a third terminal thereof, or to control the conduction between a second terminal and the third terminal thereof;
performing data writing or data reading on the memory cell comprising:
determining whether the first storage node fails, wherein
when it is determined that the first storage node fails, performing the data writing or the data reading on the second storage node; and
when it is determined that the first storage node does not fail, performing the data writing or the data reading on the first storage node.

* * * * *